United States Patent  (10) Patent No.: US 7,932,806 B2
Sato et al.  (45) Date of Patent: Apr. 26, 2011

(54) VARISTOR AND LIGHT EMITTING DEVICE

(75) Inventors: Hiroyuki Sato, Tokyo (JP); Yo Saito, Tokyo (JP); Ryuichi Tanaka, Tokyo (JP); Makoto Numata, Tokyo (JP); Goro Takeuchi, Tokyo (JP)

(73) Assignee: TDK Corporation, Tokyo (JP)

( * ) Notice: Subject to any disclaimer, the term of this patent is extended or adjusted under 35 U.S.C. 154(b) by 529 days.

(21) Appl. No.: 12/055,671

(22) Filed: Mar. 26, 2008

(65) Prior Publication Data

US 2008/0238604 A1    Oct. 2, 2008

(30) Foreign Application Priority Data

Mar. 30, 2007 (JP) ................ P2007-092821
May 21, 2007 (JP) ................ P2007-134429

(51) Int. Cl.
*H01C 7/10* (2006.01)
(52) U.S. Cl. ........................... 338/21; 338/20
(58) Field of Classification Search .............. 338/20–21, 338/22 R, 25
See application file for complete search history.

(56) References Cited

U.S. PATENT DOCUMENTS

2006/0061449 A1  3/2006 Kazama
2007/0200133 A1  8/2007 Hashimoto et al.

FOREIGN PATENT DOCUMENTS

| EP | 1 580 809 A2 | 9/2005 |
|---|---|---|
| JP | A-2002-100826 | 4/2002 |
| JP | A 2002-246207 | 8/2002 |
| JP | A-2002-252136 | 9/2002 |
| JP | A-2006-86274 | 3/2006 |
| JP | A-2006-287020 | 10/2006 |

*Primary Examiner* — Kyung Lee
(74) *Attorney, Agent, or Firm* — Oliff & Berridge, PLC

(57) ABSTRACT

In a varistor, a heat radiating portion contains the same components as ZnO that is the main component of a varistor element body, as metal oxides, thereby, the structural components of the varistor element body and the heat radiating portion are caused to be common. During firing, Ag contained in the heat radiating portion diffuses into the grain boundaries of ZnO, near the interface between surfaces of the heat radiating portion and the varistor element body. Consequently, in the varistor, cracks hardly occur between the varistor portion and the heat radiating portion during firing (or during binder removal), thereby, ensuring sufficient bonding strength between the varistor portion and the heat radiating portion. Therefore, heat conducted to the varistor portion is radiated efficiently conducting through electrically conducted paths formed in the heat radiating portion from the surface facing the varistor element body to other three surfaces of the heat radiating portion.

13 Claims, 9 Drawing Sheets

VARISTOR AND LIGHT EMITTING DEVICE

BACKGROUND OF THE INVENTION

1. Field of the Invention

The present invention relates to a varistor and a light emitting device having the same.

2. Related Background Art

There is a varistor including an element body having a varistor element body exhibiting voltage nonlinearity and a pair of internal electrodes arranged inside the varistor element body with sandwiching a part of the varistor element body between the internal electrodes, and a pair of terminal electrodes formed on an outer surface of the element body and respectively connected to their corresponding internal electrodes (refer to, for example, Japanese Patent Application Laid-Open No. 2002-246207).

SUMMARY OF THE INVENTION

Varistors can protect electronic elements, such as a semiconductor light emitting element and an FET (Field Effect Transistor), from ESD (Electrostatic Discharge) surges when connected in parallel to the electronic elements. The electronic elements include ones which generate heat during their operation. High temperature state of the electronic element causes deterioration in characteristics of the element itself, and thereby affecting its operation. Therefore it is necessary to radiate the generated heat efficiently.

The present invention has been accomplished in order to solve the above problem and an object of the invention is to provide a varistor and a light emitting device capable of efficiently radiating heat.

Inventors of the present invention considered that by providing a metal so as to be brought into contact with the varistor element body and by radiating heat conducted to the varistor from the metal, heat can be radiated from the varistor efficiently. However, when the metal is brought into contact with one surface of the outer side of the varistor element body, the bonding strength between them is weak, and thereby in some cases, the varistor element body and the metal are separated from each other. In this case, heat conducted from the metal portion to the varistor cannot be radiated efficiently. Therefore, in order to solve the problem, the inventors of the present invention have invented such a varistor and a light emitting device that have reinforced bonding strength between the metal and the varistor element body.

In one aspect, a varistor in accordance with the present invention, includes: a varistor portion including a varistor element body exhibiting voltage nonlinearity and internal electrodes arranged so that they sandwich the varistor element body and at least parts thereof face each other; external electrodes connected to the internal electrodes for serving as connection ends of an external element; and a heat radiating portion thermally connected to the varistor portion; wherein the varistor element body contains semiconductor ceramics as a main component, and the heat radiating portion is composed of a composite material of a metal and metal oxides.

Moreover, in another aspect, a varistor in accordance with the present invention, includes: a varistor portion including a varistor element body exhibiting voltage nonlinearity, electrode portions arranged inside the varistor element body, and electrode portions which is arranged on a surface of the varistor element body and at least parts of which face the electrode portion arranged inside the varistor element body each other; and a heat radiating portion thermally connected to the varistor portion; wherein the varistor element body contains semiconductor ceramics as a main component, and the heat radiating portion is composed of a composite material of a metal and metal oxides.

In the varistor, similar to the varistor element body containing semiconductor ceramics as a main component, the heat radiating portion contains metal oxides. Common structural components of the varistor element body and the heat radiating portion, prevents cracks from occurring between the varistor portion and the heat radiating portion during firing etc., ensuring the sufficient bonding strength between the varistor portion and the heat radiating portion. Thereby, heat conducted from the external element to the varistor portion is radiated efficiently by the metal of the heat radiating portion.

Moreover, it is preferable for the metal to be electrically conducted from the surface contacting with the varistor portion to the surface not contacting with the varistor portion, in the heat radiating portion. In this case, the efficiency of the heat radiation by the heat radiating portion will be higher.

Moreover, it is preferable for the metal oxide to contain ZnO. This case more surely prevents the cracks from occurring between the varistor portion and the heat radiating portion during firing etc., ensuring the sufficient bonding strength between the varistor portion and the heat radiating portion.

Moreover, it is preferable for the metal oxide to contain metal-coated $Al_2O_3$. In this case, on the heat radiating portion, heat radiating paths by a metal can be easily formed, enabling the efficiency of heat dissipation to be enhanced.

Moreover, it is preferable for the metal to contain Ag as a main component. Since Ag diffuses into the grain boundaries of ZnO that is the main component of the varistor element body, the bonding strength between the varistor portion and the heat radiating portion is further enhanced.

Moreover it is preferable for the varistor portion and the heat radiating portion to be formed by firing simultaneously. This case can simplify the manufacturing process.

Moreover, in one aspect, in a light emitting device in accordance with the present invention, including a semiconductor light emitting element and a varistor, the varistor includes: a varistor portion including a varistor element body exhibiting voltage nonlinearity and internal electrodes arranged so that they sandwich the varistor element body and at least parts thereof face each other; external electrodes connected to the internal electrodes for serving as connection ends of the semiconductor light emitting element; and a heat radiating portion arranged so as to be in contact with the varistor portion; wherein the varistor element body contains ZnO as a main component, and the heat radiating portion is composed of a composite material of a metal and metal oxides.

In the light emitting device, similar to the varistor element body containing ZnO as a main component, the heat radiating portion contains metal oxides. Common structural components of the varistor element body and the heat radiating portion, prevents cracks from occurring between the varistor portion and the heat radiating portion during firing etc., ensuring the sufficient bonding strength between the varistor portion and the heat radiating portion. Thereby, heat conducted from the semiconductor light emitting element to the varistor portion via the external electrodes is radiated efficiently by the metal of the heat radiating portion.

According to the varistor and the light emitting device in accordance with the present invention, heat can be radiated efficiently.

DESCRIPTION OF THE PREFERRED EMBODIMENTS

The preferred embodiments of the varistor and the light emitting device according to the present invention will be described below in detail with reference to the drawings.

First Embodiment

Figure 1:
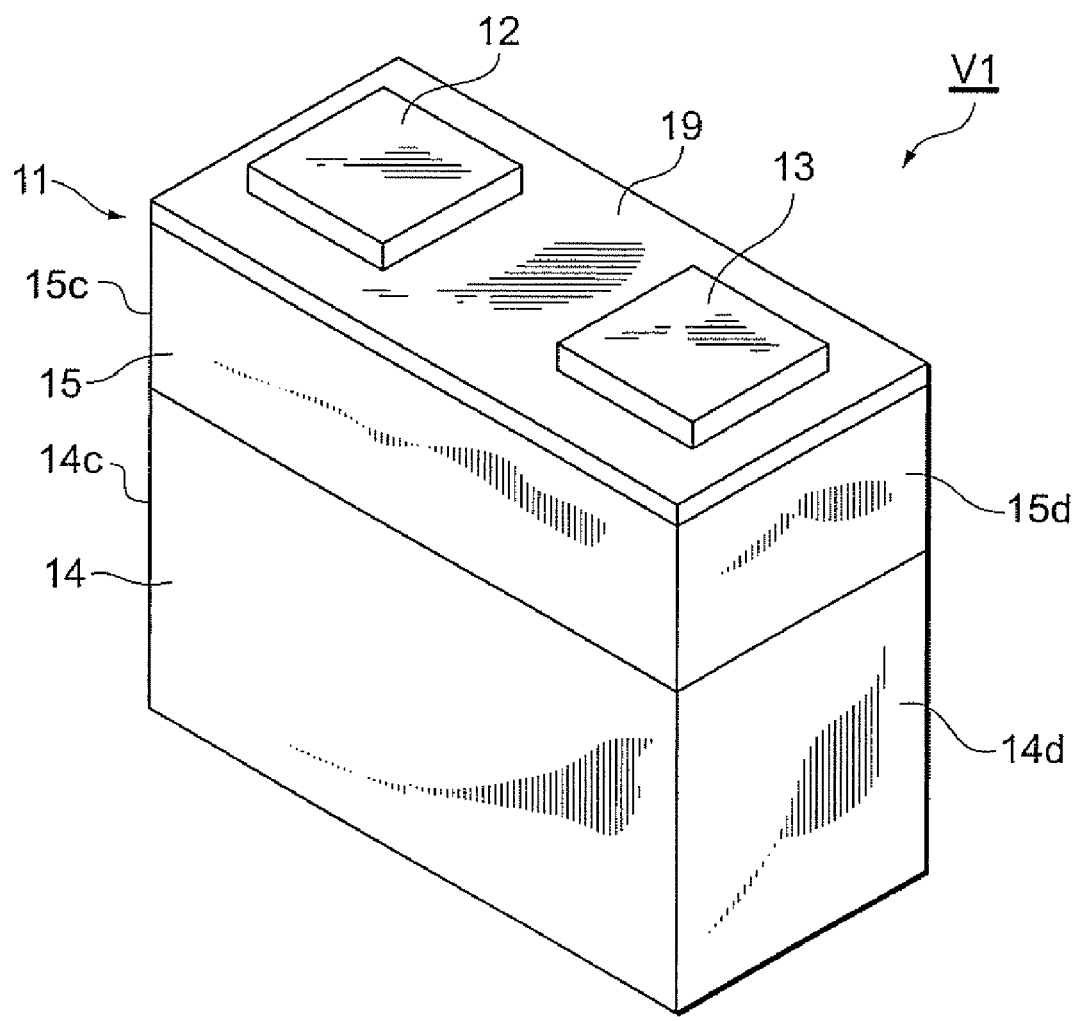
FIG. 1 is a schematic perspective view illustrating a varistor in accordance with a first embodiment of the present invention.
Figure 2:
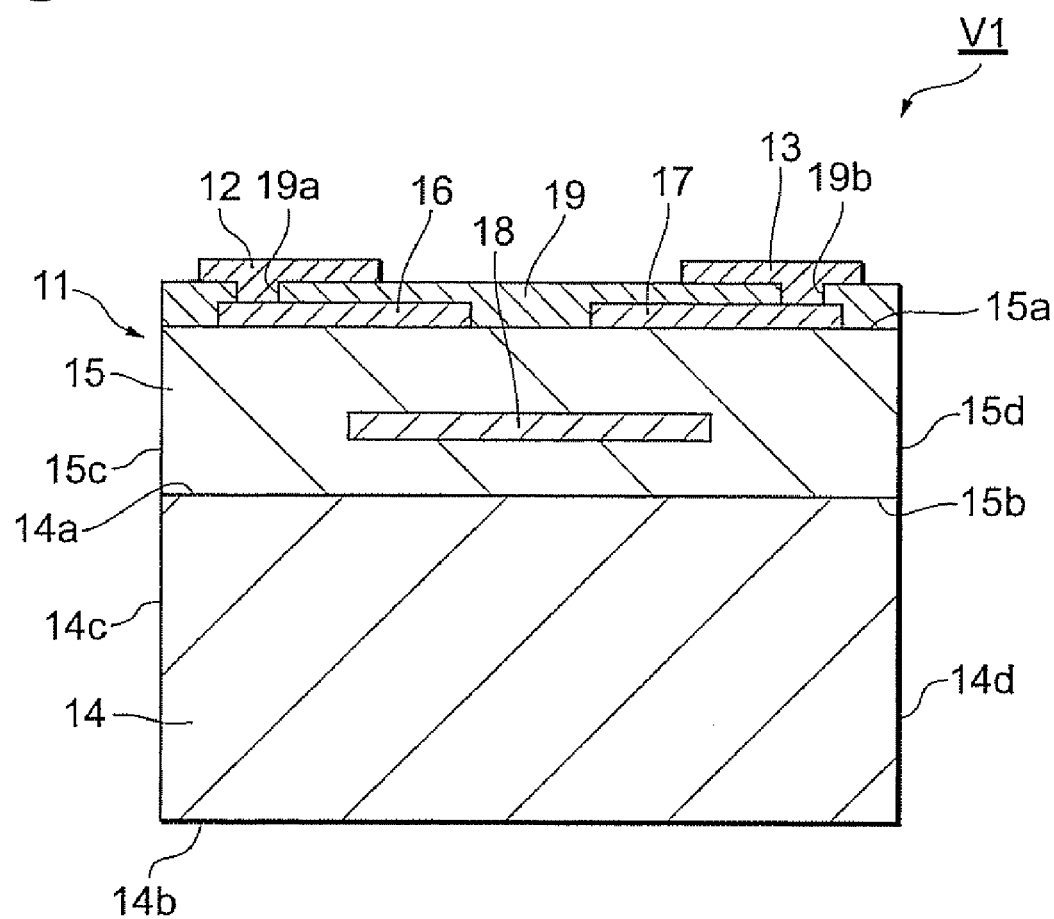
FIG. 2 is a schematic cross-sectional view of the varistor illustrated in FIG. 1.

FIG. 1 is a schematic perspective view of a varistor in accordance with a first embodiment of the present invention. Moreover, FIG. 2 is the schematic cross-sectional view thereof. As illustrated in FIGS. 1 and 2, a varistor V1 includes a varistor portion 11, a pair of external electrodes 12 and 13, and a heat radiating portion 14, and has a shape of substantially rectangular parallelepiped.

The varistor portion 11 includes a varistor element body 15, a first internal electrode 16, a second internal electrode 17, and a third internal electrode 18. The varistor element body 15 has a shape of substantially rectangular parallelepiped, and has surfaces 15$a$ and 15$b$ facing each other, surfaces 15$c$ and 15$d$ facing each other, which are perpendicular to the surfaces 15$a$ and 15$b$, and two surfaces facing each other, which are neighboring to the surfaces 15$c$ and 15$d$, respectively.

The varistor element body 15 is a laminated body which is formed by laminating a plurality of varistor layers. Each of the varistor layers is a portion having a function to exhibit voltage nonlinearity, and contains ZnO as a main component and Pr or Bi as sub-components. These sub-components are present in the varistor layer as simple metal or metal oxides. In addition, the actual varistor V1 is integrated to such an extent that boundaries between the multiple varistor layers are invisible.

The first internal electrode 16 and the second internal electrode 17 are arranged on the surface 15$a$ of the varistor element body 15. The first internal electrode 16 and the second internal electrode 17 have a rectangular shape, viewed from a direction perpendicular to the surface 15$a$, respectively, and are symmetrically arranged each other with a gap. The first internal electrode 16 is not exposed on the surface 15$c$ of the varistor element body 15 and the two side surfaces neighboring to the surface 15$c$, and extends to a position inner from each of the edges of the surface 15$a$ by predetermined distances. Similarly, the second internal electrode 17 is not exposed on the surface 15$d$ of the varistor element body 15 and the two side surfaces neighboring to the surface 15$d$, and extends to a position inner from each of the edges of the surface 15$a$ by predetermined distances.

Moreover, the first internal electrode 16 and the second internal electrode 17 are coated with a glaze 19 containing glass as a main component, and electrically insulated from each other. In the glaze 19, openings 19$a$ and 19$b$ are formed at positions corresponding to the first internal electrode 16 and the second internal electrode 17, respectively. Thereby, parts of the surfaces of the first internal electrode 16 and the second internal electrode 17 are in a state being exposed from the glaze 19.

The third internal electrode 18 is arranged at a substantially central portion in the varistor element body 15 so as to face the first internal electrode 16 and the second internal electrode 17 each other, with sandwiching multiple layers of varistor layers between them. The third internal electrode 18 is electrically insulated from the first internal electrode 16 and the second internal electrode 17, each other.

External electrodes 12 and 13 are symmetrically formed with being separated from each other on the outer surface of the glaze 19 so as to correspond to the first internal electrode 16 and the second internal electrode 17, respectively. The external electrodes 12 and 13 also extend inside the openings 19$a$ and 19$b$ in the glaze 19, and are in contact with the first internal electrode 16 and the second internal electrode 17 exposed from the glaze 19, respectively Thereby, the external electrode 12 is electrically and physically connected to the first internal electrode 16, and the external electrode 13 is electrically and physically connected to the second internal electrode 17. The external electrodes 12 and 13 act as the connection ends of an external element such as a semiconductor light emitting element 61 (refer to FIG. 7).

Similar to the varistor element body 15, the heat radiating portion 14 has a shape of substantially rectangular parallelepiped, and surfaces 14$a$ and 14$b$ facing each other, surfaces 14$c$ and 14$d$ facing each other, which are perpendicular to the surfaces 14$a$ and 14$b$, and two surfaces facing each other, which are neighboring to the surfaces 14$c$ and 14$d$, respectively. The surface 14$a$ of the heat radiating portion 14 is bonded to the surface 15$b$ of the varistor element body 15.

The heat radiating portion 14 is formed with a composite material of a metal and metal oxides. As the metal so called here, for example, Ag, Ag/Pd, Pd or the like can be used, however, from the viewpoint of thermal conductivity, it is preferable to use Ag. Moreover, as the metal oxide, $Al_2O_3$, ZnO, $SiO_2$, and $ZrO_2$ are used. For $Al_2O_3$, particles of this metal oxide coated with Ag by means of, for example, electroless plating, are used. In addition, it is not always necessary for the metal oxide to contain all of $Al_2O_3$, ZnO, $SiO_2$, and $ZrO_2$ mentioned above, instead, it is possible for the metal oxide to contain at least one kind of them.

The heat radiating portion 14 like this is formed by firing simultaneously with the varistor portion 1, in a state where the surface 14$a$ is in contact with the surface 15$b$ of the varistor element body 15. The inside of the heat radiating portion 14 is electrically conducted by a metal of Ag from the surface 14$a$ contacting with the varistor portion 11 to the surfaces 14$b$, 14$c$ and 14$d$ not contacting with the varistor portion 11. The electrically conducted paths are more surely established by Ag-coated $Al_2O_3$.

Subsequently, the manufacturing process of the above-mentioned varistor V1 will be described.

First, by mixing ZnO as the main component of the varistor element body 15 and metal of Pr or Bi as the sub-component of the varistor element body 15 at a predetermined ratio, a varistor material is prepared. Next, by adding organic binders, organic solvents, and organic plasticizers etc. to the varistor material, slurry is obtained.

After coating the slurry on a film, by drying the coated film, a green sheet is obtained. Next, on the green sheet, electrode portions each corresponding to the first to third internal electrodes 16, 17 and 18 are formed. The electrode portions are formed by printing an electrically conductive paste in which metal powder mainly containing Ag particles are mixed with organic binders and organic solvents, on the varistor element body, and drying it.

Next, by superposing green sheets on which the electrode portions are formed and green sheets on which the electrode portions are not formed in a predetermined order, a sheet-laminated body is formed. Then, by slicing the resultant sheet-laminated body into chip units, green bodies corresponding to the varistor portions 11 are obtained. After that, by subjecting the green bodies to heating treatment at a temperature of, for example, 180 to 400° C., for about 0.5 to 24 hours, binder removal treatment is performed.

Next, the heat radiating portion 14 composed of a composite material of Ag, $Al_2O_3$, ZnO, $SiO_2$, and $ZrO_2$ is provided. Then, the green bodies mentioned above are superposed on the surfaces 14a of the heat radiating portions 14, and they are simultaneously fired in air atmosphere or under an $O_2$ atmosphere at a temperature of 800° C. or more. Thereby, bonded bodies of the varistor portion 11 and the heat radiating portion 14 are formed. Subsequently, the glaze 19 is printed on each of the resultant bonded bodies so as to cover the first internal electrode 16 and the second internal electrode 17, and further, electrode portions respectively corresponding to the external electrodes 12 and 13 are printed thereon so as to close the openings 19a and 19b of the glaze 19.

The electrode portions are formed by printing conductive paste in which Au particles or metal powder mainly containing Au particles are mixed with organic binders and organic solvents on the glaze 19 and drying the printed body. Then, by firing the resultant printed bodies simultaneously under an $O_2$ atmosphere at a temperature of 800° C. or more, the external electrodes 12 and 13 are formed, resulting in completion of the varistors V1 illustrated in FIGS. 1 and 2.

In the varistor V1, the heat radiating portion 14 contains the same components as ZnO that is the main component of the varistor element body 15, as metal oxides, and thereby the structural components of the varistor element body 15 and the heat radiating portion 14 are caused to be common. Moreover, during firing, Ag contained in the heat radiating portion 14, diffuses into the grain boundaries of ZnO that is the main component of the varistor element body 15, near the interface between the surface 14a and the surface 15b. Thereby, the varistor portion 11 and the heat radiating portion 14 are firmly bonded.

For this reason, in the varistor V1, during firing (or during binder removal), cracks hardly occur between the varistor portion 11 and the heat radiating portion 14, thereby ensuring sufficient bonding strength between the varistor portion 11 and the heat radiating portion 14. Therefore, heat conducted to the varistor portion 11 from an external element via the external electrodes 12 and 13, is radiated efficiently by conducting electrically conducted paths formed in the heat radiating portion 14 from the surface 14a to the surfaces 14b, 14c and 14d by the Ag particles and the $Al_2O_3$-coated portion.

Moreover, in the varistor V1, the varistor portion 11 and the heat radiating portion 14 are fired simultaneously. This achieves simplification of the manufacturing process, thereby contributing to improvement of the efficiency of manufacturing the varistor V1 and the cost reduction of the manufacturing process.

Second Embodiment

Figure 3:
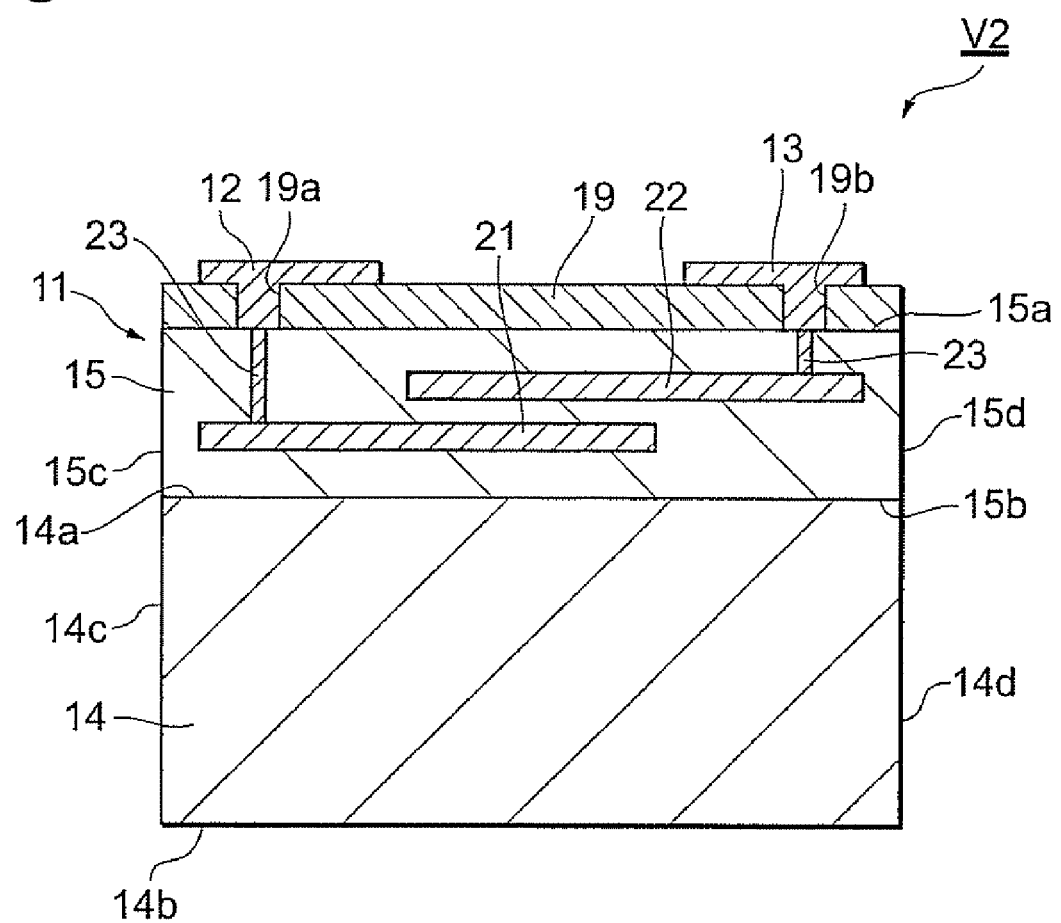
FIG. 3 is a schematic cross-sectional view illustrating a varistor in accordance with a second embodiment of the present invention.

A varistor in accordance with a second embodiment of the present invention, will be described, FIG. 3 is a schematic cross-sectional view illustrating the varistor in accordance with the second embodiment of the present invention. The varistor V2 illustrated in FIG. 3 differs from the varistor V1 in accordance with the first embodiment, in the configuration of the internal electrodes thereof.

In other words, the varistor V2 is not provided with a third internal electrode 18 (refer to FIG. 2), and instead, it includes a first internal electrode 21 and a second internal electrode 22 arranged inside a varistor element body 15 so that one-end sides thereof face each other. In addition, the first internal electrode 21 and the second internal electrode 22 are connected to the external electrodes 12 and 13 by each of penetrating conductors 23, respectively.

In the varistor V2, the varistor element body 15 also contains composed ZnO as a main component, and the heat radiating portion 14 is formed with a composite material of metal Ag and metal oxides containing ZnO that is the main component of the varistor element body 15. Therefore, similar to the first embodiment, the bonding strength between the varistor portion 11 and the heat radiating portion 14 is sufficiently ensured, and heat conducted to the varistor portion 11 from an external element via the external electrodes 12 and 13, is radiated efficiently by conducting electrically conducted paths formed in the heat radiating portion 14 from the surface 14a to the surfaces 14b, 14c and 14d.

Third Embodiment

Figure 4:
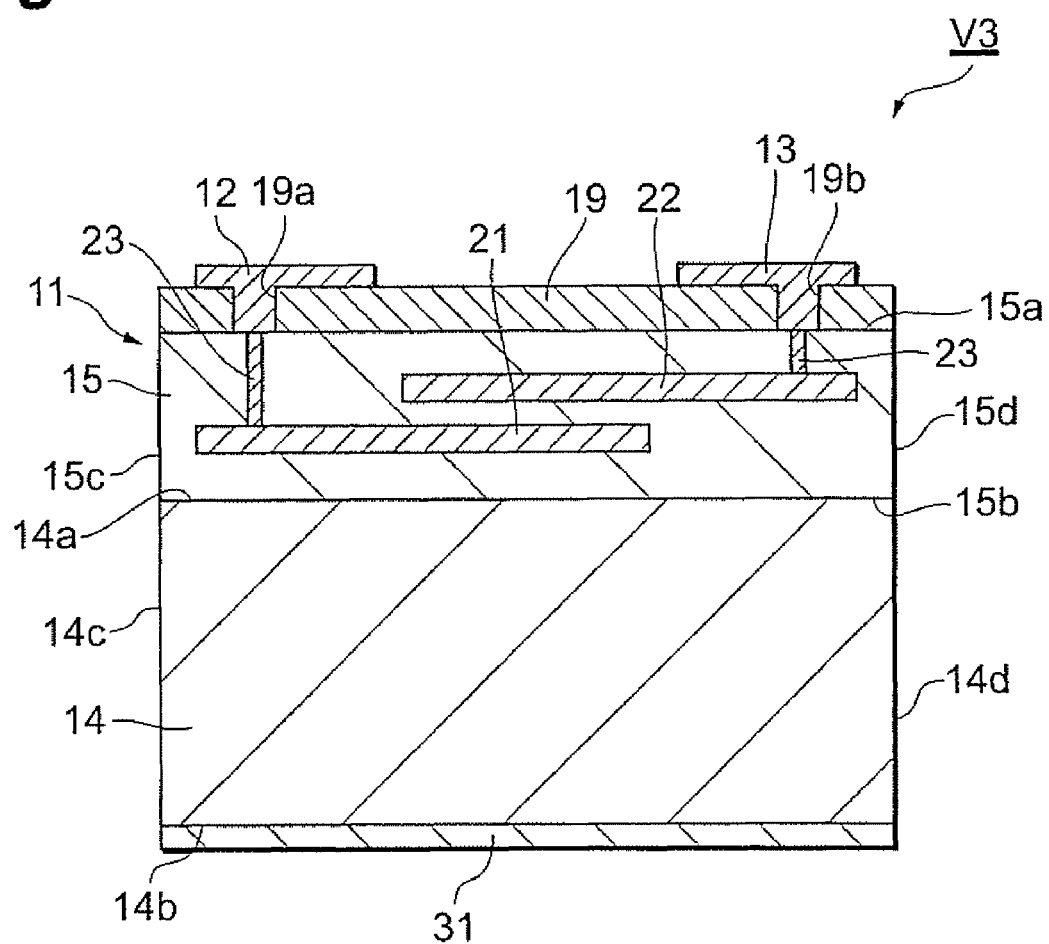
FIG. 4 is a schematic cross-sectional view illustrating a varistor in accordance with a third embodiment of the present invention.

A varistor in accordance with a third embodiment of the present invention, will be described. FIG. 4 is a schematic cross-sectional view illustrating the varistor in accordance with the third embodiment of the present invention. The varistor V3 illustrated in FIG. 4, further differs from the varistor V2 in accordance with the second embodiment, in that glaze 31 is also formed at the side of the surface 14b not contacting with the varistor portion 11 in the heat radiating portion 14.

In the varistor V3, the varistor element body 15 also contains ZnO as a main component, and the heat radiating portion 14 is formed with a composite material of metal Ag and metal oxides containing ZnO that is the main component of the varistor element body 15. Therefore, the bonding strength between the varistor portion 11 and the heat radiating portion 14 is sufficiently ensured, and heat conducted to the varistor portion 11 from an external element via the external electrodes 12 and 13, is radiated efficiently by conducting electrically conducted paths formed in the heat radiating portion 14 from the surface 14a to the surfaces 14b, 14c and 14d.

Fourth Embodiment

Figure 5:
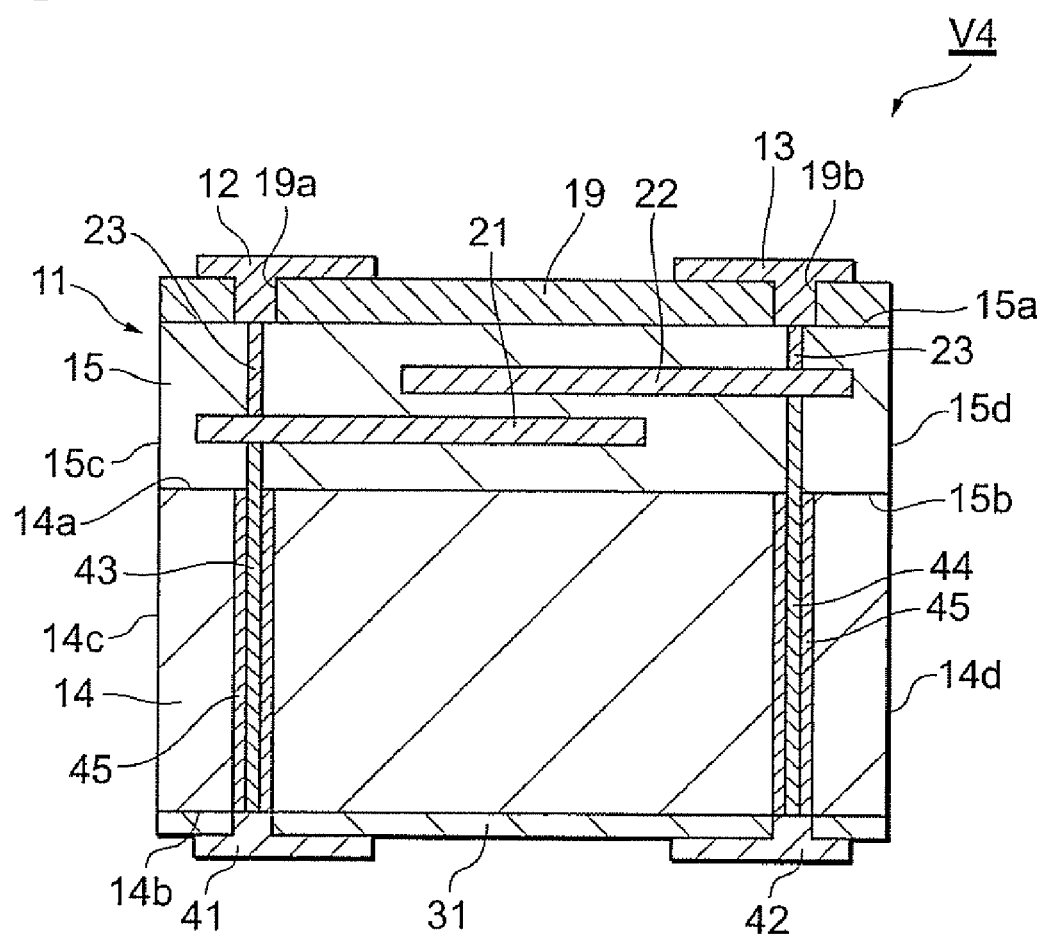
FIG. 5 is a schematic cross-sectional view illustrating a varistor in accordance with a fourth embodiment of the present invention.

A varistor in accordance with a fourth embodiment of the present invention, will be described, FIG. 5 is a schematic cross-sectional view illustrating the varistor in accordance with the fourth embodiment of the present invention. The varistor V4 illustrated in FIG. 5 further differs from the varistor V3 in accordance with the third embodiment, in that additional external electrodes 41 and 42 are formed on the outer surface of the glaze 31 formed at the side of the surface 14b not contacting with the varistor portion 11.

In the varistor V4, one external electrode 12 formed at the side of the varistor portion 11, a first internal electrode 21, and one external electrode 41 formed at the side of the heat radiating portion 14 are connected by a penetrating electrode 43, and further, the other external electrode 13 formed at the side of the varistor portion 11, a second internal electrode 22, and the other external electrode 42 formed at the side of the heat radiating portion 14 are connected by a penetrating electrode 44. Moreover, around the penetrating electrodes 43 and 44 passing through the heat radiating portion 14, layers 45 having electrical insulating properties are formed, respectively.

In the varistor V4, the varistor element body 15 also contains ZnO as a main component, and the heat radiating portion 14 is formed with a composite material of metal Ag and metal oxides containing ZnO that is the main component of the varistor element body 15. Therefore, the bonding strength between the varistor portion 11 and the heat radiating portion 14 is sufficiently ensured, and heat conducted to the varistor portion 11 from an external element via the external electrodes 12 and 13, is radiated efficiently by conducting electrically conducted paths formed in the heat radiating portion 14 from the surface 14a to the surfaces 14c and 14d.

In addition, in the varistor V4, the external electrodes 12 and 13 formed at the side of the varistor portion 11 may be used as the connection ends of an external element, or the external electrodes 41 and 42 formed at the side of the heat radiating portion 14 may be used as the connection ends of the external element.

Fifth Embodiment

Figure 6:
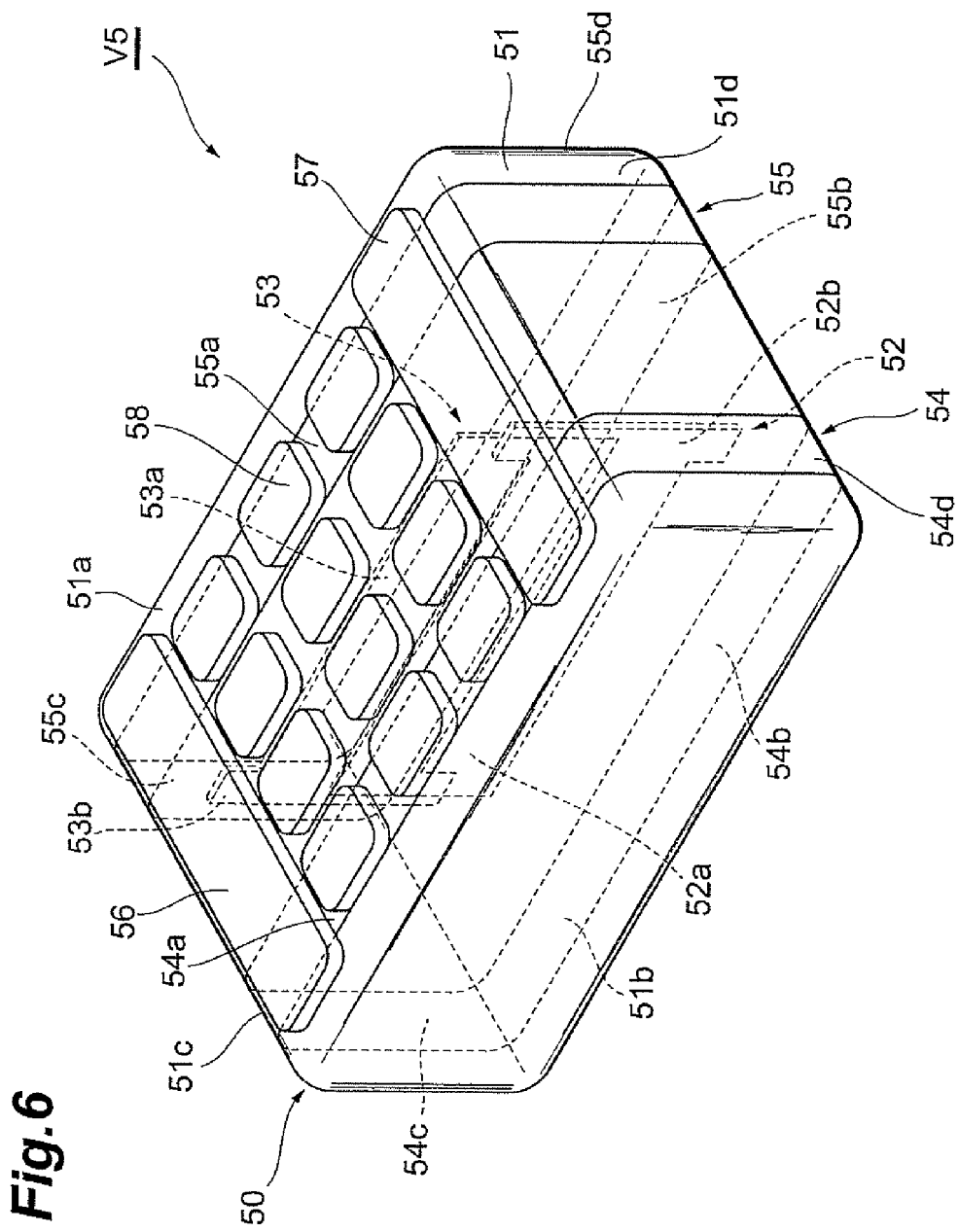
FIG. 6 is a schematic perspective view illustrating a varistor in accordance with a fifth embodiment of the present invention.

A varistor in accordance with a fifth embodiment of the present invention, will be described. FIG. 6 is a schematic perspective view illustrating the varistor in accordance with the fifth embodiment of the present invention. A varistor V5 illustrated in FIG. 6 differs in the configuration of a varistor portion 50 from the above-mentioned embodiments. In other words, the varistor V5 includes first and second internal electrodes 52 and 53 and first and second heat radiating portions 54 and 55 inside a varistor element body 51. Moreover, on one surface 51a of the varistor element body 51, external electrodes 56 and 57 are provided.

The first internal electrode 52 has a flat plate portion 52a and a connection piece 52b protruding from one end portion of the flat plate portion 52a toward one surface 51a of the varistor element body 51, and the second internal electrode 53 has a flat plate portion 53a and a connection piece 53b protruding from one end portion of the flat plate portion 53a toward the other surface 51b of the varistor element body 51. The first internal electrode 52 and the second internal electrode 53 are arranged so that the connection pieces 52b and 53b are located at opposite side each other with sandwiching multiple layers of varistor layers between them, and most parts of the flat plate portions 52a and 53b are in a state facing each other, respectively. One tip end portion of each of the connection pieces 52b and 53b is drawn so as to be exposed on the surface 51a of the varistor element body 51, and the other tip end portion is drawn so as to be exposed on the surface 51b.

The first heat radiating portion 54 and the second heat radiating portion 55 have a plate like shape with a thickness thicker than those of the first and the second internal electrodes 52 and 53, and are arranged substantially in parallel with each other so as to sandwich the first and the second internal electrodes 52 and 53 between them. The widthwise surfaces 54a and 54b of the first heat radiating portion 54 are exposed on the surfaces 51a and 51b of the varistor element body 51, respectively, and the lengthwise end surfaces 54c and 54d thereof are exposed on the surfaces 51c and 51d of the varistor element body 51, respectively, which are perpendicular to the surfaces 51a and 51b and face each other.

Similarly, the widthwise surfaces 55a and 55b of the second heat radiating portion 55 are exposed on the surfaces 51a and 51b of the varistor element body 51, respectively, and the lengthwise end surfaces 55c and 55d are exposed on the surfaces 51c and 51d of the varistor element body 51, respectively, which are perpendicular to the surfaces 51a and 51b and face each other.

The external electrodes 56 and 57 are formed along the edges of the surface 51c side and the edges of the surface 51d side on the surface 51a of the varistor element body 51 so as to intersect with the first internal electrode 52, the second internal electrode 53, the first heat radiating portion 54 and the second heat radiating portion 55, respectively. The external electrode 56 is electrically and physically connected to the connection piece 53b of the second internal electrode 53, the first heat radiating portion 54, and the second heat radiating portion 55, and the external electrode 57 is electrically and physically connected to the connection piece 52b of the first internal electrode 52, the first heat radiating portion 54, and the second heat radiating portion 55.

In addition, on the surface 51a of the varistor element body 51, between the external electrodes 56 and 57, pad electrodes 58 are arranged in a matrix of, for example, 3 rows and 4 columns. Among the pad electrodes 58, pad electrodes 58 corresponding to outer columns (the first and fourth columns) are brought into contact with the first heat radiating portion 54 and the second heat radiating portion 55, respectively.

In the varistor V5, the varistor element body 51 also contains ZnO as a main component, and the first heat radiating portion 54 and the second heat radiating portion 55 are formed with a composite material of metal Ag and metal oxides containing ZnO that is the main component of the varistor element body 51. Therefore, the bonding strength between the varistor portion 50 and the first heat radiating portion 54 and the bonding strength between the varistor portion 50 and the second heat radiating portion 55 are sufficiently ensured, and heat conducted to the varistor portion 50 from an external element via the external electrodes 56 and 57 and the pad electrodes 58, is radiated efficiently by conducting electrically conducted paths formed in the first heat radiating portion 54 from the surface 54a to the surfaces 54b, 54c and 54d, and electrically conducted paths formed in the second heat radiating portion 55 from the surface 55a to the surfaces 55b, 55c and 55d.

Figure 7:
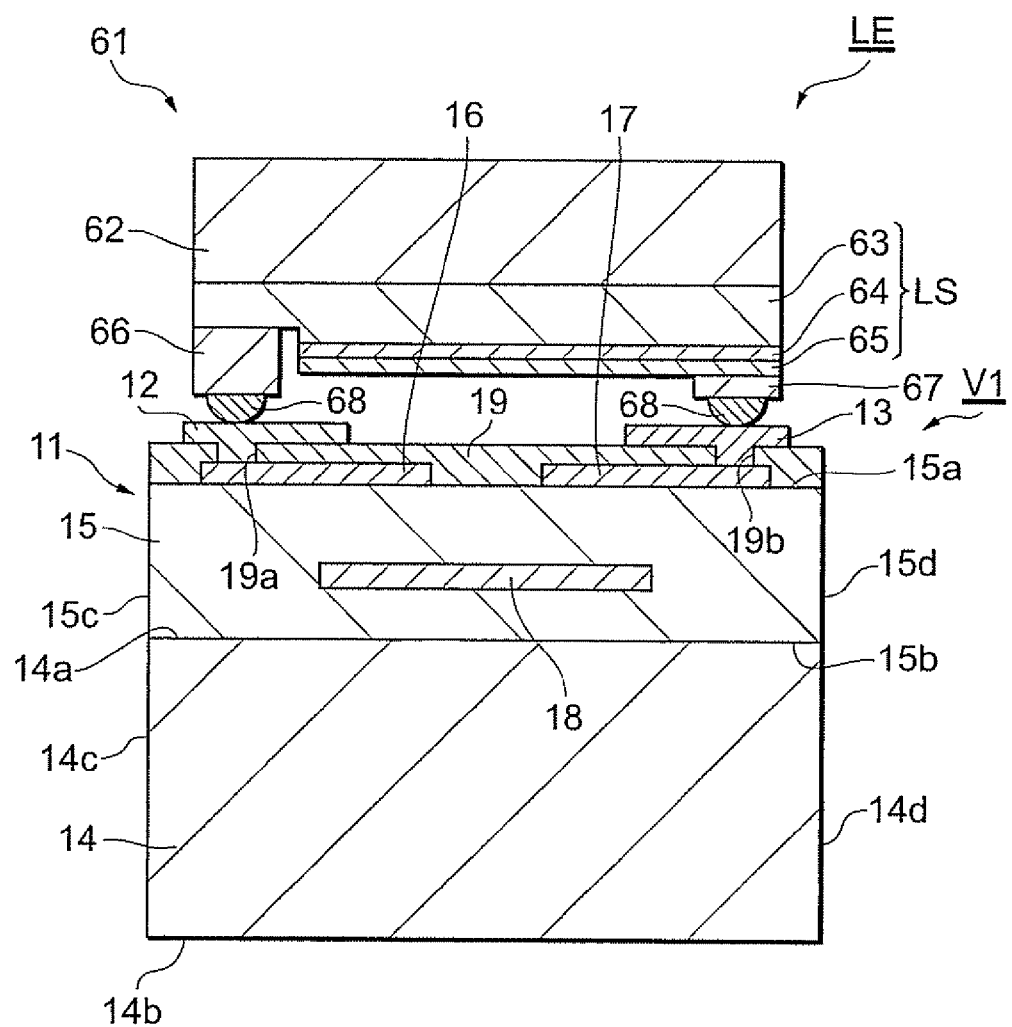
FIG. 7 is a schematic cross-sectional view illustrating a light emitting device in accordance with one embodiment of the present invention.

(Light Emitting Device) Subsequently, a light emitting device in accordance with one embodiment of the present invention will be described. FIG. 7 is a schematic cross-sectional view illustrating the light emitting device in accordance with one embodiment of the present invention. A light emitting device LE includes, for example, the above-mentioned varistor V1 and a semiconductor light emitting element 61 electrically connected to the varistor V1.

The semiconductor light emitting element 61 is a light-emitting diode (LED) made of a GaN (gallium nitride)-based semiconductor including a substrate 62 and a layer structure LS formed on the substrate 62. The GaN-based semiconductor LED has been known well, and thus will be described only in brief. The substrate 62 is an optically transparent, electrically insulating substrate made of sapphire. The layer structure LS includes an n-type (first conductivity type) semiconductor region 63, a light emitting layer 64, and a p-type (second conductivity type) semiconductor region 65 which are laminated. The semiconductor light emitting element 61 emits light depending on a voltage applied between the n-type semiconductor region 63 and the p-type semiconductor region 65.

The n-type semiconductor region 63 is configured by containing an n-type nitride semiconductor. In the present embodiment, the n-type semiconductor region 63 is formed by epitaxially growing GaN on the substrate 62 and has an n-type conductivity by being doped with an n-type dopant, for example, such as Si. The n-type semiconductor region 63 may have such a composition as to yield a smaller refractive index and greater bandgap than those of the light emitting layer 64. In this case, the n-type semiconductor region 63 acts as a lower cladding for the light emitting layer 64.

The light emitting layer 64 is formed on the n-type semiconductor region 63, and emits light in its light emitting region when carriers (electrons and holes) supplied from the n-type semiconductor region 63 and the p-type semiconductor region 65 are recombined. The light emitting layer 64 may have, for example, a multiple quantum well (MQW) structure in which barrier layers and well layers are alternately laminated over a plurality of periods. In this case, the barrier layers and well layers are made of InGaN, while their In (indium) compositions are appropriately selected so that the barrier layers have a bandgap greater than that of the well layers. The light emitting region is generated in a region where the carriers are injected in the light emitting layer 64.

The p-type semiconductor region 65 is configured by containing a p-type nitride semiconductor, In the present embodiment, the p-type semiconductor region 65 is formed by epitaxially growing AlGaN on the light emitting layer 64 and has a p-type conductivity by being doped with a p-type dopant, for example, such as Mg. Moreover, the p-type semiconductor region 65 may have such a composition as to yield a smaller refractive index and greater bandgap than those of the light emitting layer 64. In this case, the p-type semiconductor region 65 acts as an upper cladding for the light emitting layer 64.

A cathode electrode 66 is formed on the n-type semiconductor region 63. The cathode electrode 66 is made of a conductive material, and an ohmic contact between the cathode electrode 66 and the n-type semiconductor region 63 is achieved. An anode electrode 67 is formed on the p-type semiconductor region 65. The anode electrode 67 is made of a conductive material, and an ohmic contact between the anode electrode 67 and the p-type semiconductor region 65 is achieved. Bump electrodes 68 are formed on the cathode electrode 66 and anode electrode 67, respectively.

In the semiconductor light emitting element 61 having the configuration mentioned above, when a predetermined voltage is applied between the anode electrode 67 (bump electrodes 68) and cathode electrode 66 (bump electrode 68), so as to flow a current, light will be emitted in the light emitting region of the light emitting layer 64.

The semiconductor light emitting element 61 is bump-connected to the first external electrode 12 and second external electrode 13. In other words, the cathode electrode 66 is electrically and physically connected to the first external electrode 12 via the bump electrode 68. The anode electrode 67 is electrically and physically connected to the second external electrode 13 via the bump electrode 68. Thereby, the varistor V1 will be connected in parallel with the semiconductor light emitting element 61. Therefore, the varistor V1 can protect the semiconductor light emitting element 61 from ESD surges.

As mentioned above, in the varistor V1, the heat radiating portion 14 contains the same components as ZnO that is the main component of the varistor element body 15, as metal oxides, thereby, the structural components of the varistor element body 15 and the heat radiating portion 14 are caused to be common. Moreover, during firing, Ag contained in the heat radiating portion 14 diffuses into the grain boundaries of ZnO that is the main component of the varistor element body 15, near the interface between surfaces 14a and 15b. Thereby, the varistor portion 11 and the heat radiating portion 14 are firmly bonded.

Therefore, also in case of the light emitting device LE, heat conducted from the semiconductor light emitting element 61 to the varistor portion 11 via the external electrodes 12 and 13 is radiated efficiently by Ag particles and the $Al_2O_3$-coated portion by conducting through electrically conducted paths formed in the heat radiating portion 14 from the surface 14a to surfaces 14b, 14c and 14d.

Sixth Embodiment

Figure 8:
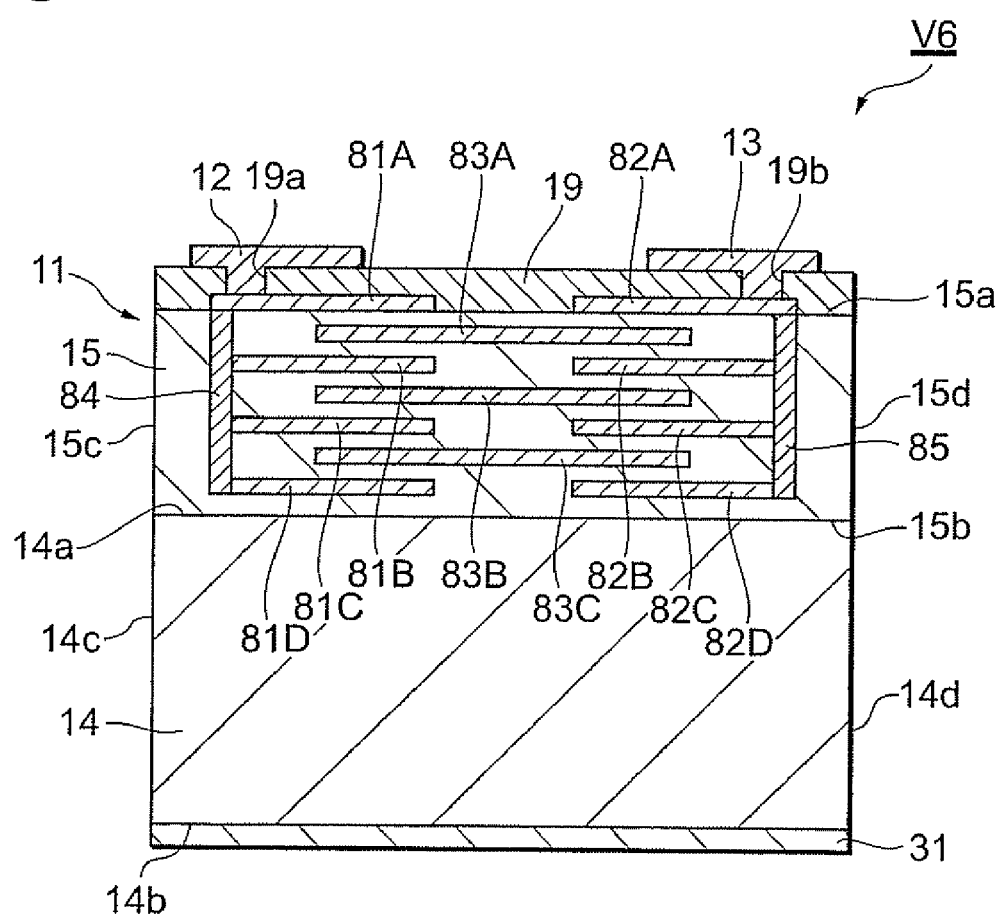
FIG. 8 is a schematic cross-sectional view illustrating a varistor in accordance with a sixth embodiment of the present invention.

A varistor in accordance with a sixth embodiment of the present invention, will be described. FIG. 8 is a schematic cross-sectional view illustrating the varistor in accordance with the sixth embodiment of the present invention. The varistor V6 illustrated in FIG. 8 differs from the varistor V1 in accordance with the first embodiment, in that a plurality of first internal electrides, a plurality of second internal electrodes, and a plurality of third internal electrodes are arranged, respectively.

In other words, similar to the varistor V1, the varistor V6 includes a first internal electrode 81A and a second internal electrode 82A symmetrically arranged each other with a gap on the surface 15a of the varistor element body 15, and a third internal electrode 83A arranged at a substantially central portion in the varistor element body 15 so as to face the first internal electrode 81A and the second internal electrode 82A each other, with sandwiching multiple layers of varistor layers between itself and the first internal electrode 81A and the second internal electrode 82A.

Moreover, in the varistor element body 15, first internal electrodes 81B to 81D, second internal electrodes 82B to 82D, and third internal electrodes 83B to 83C, are arranged at the side of the heat radiating portion 14 than the third internal electrode 83A in the same positional relationship as that of the first internal electrode 81A, the second internal electrode 82A, and the third internal electrode 83A. The first internal electrodes 81A to 81D are electrically connected each other by a penetrating electrode 84, and the second internal electrodes 82A to 82D are electrically connected each other by a penetrating electrode 85.

In the varistor V6, the varistor element body 15 also contains ZnO as a main component, and the heat radiating portion 14 is formed with a composite material of metal Ag and metal oxides containing ZnO that is the main component of the varistor element body 15. Therefore, the bonding strength between the varistor portion 11 and the heat radiating portion 14 is sufficiently ensured, and heat conducted to the varistor portion 11 from an external element via the external electrodes 12 and 13 is radiated efficiently by conducting electrically conducted paths formed in the heat radiating portion 14 from the surface 14a to the surfaces 14c and 14d.

Seventh Embodiment

Figure 9:
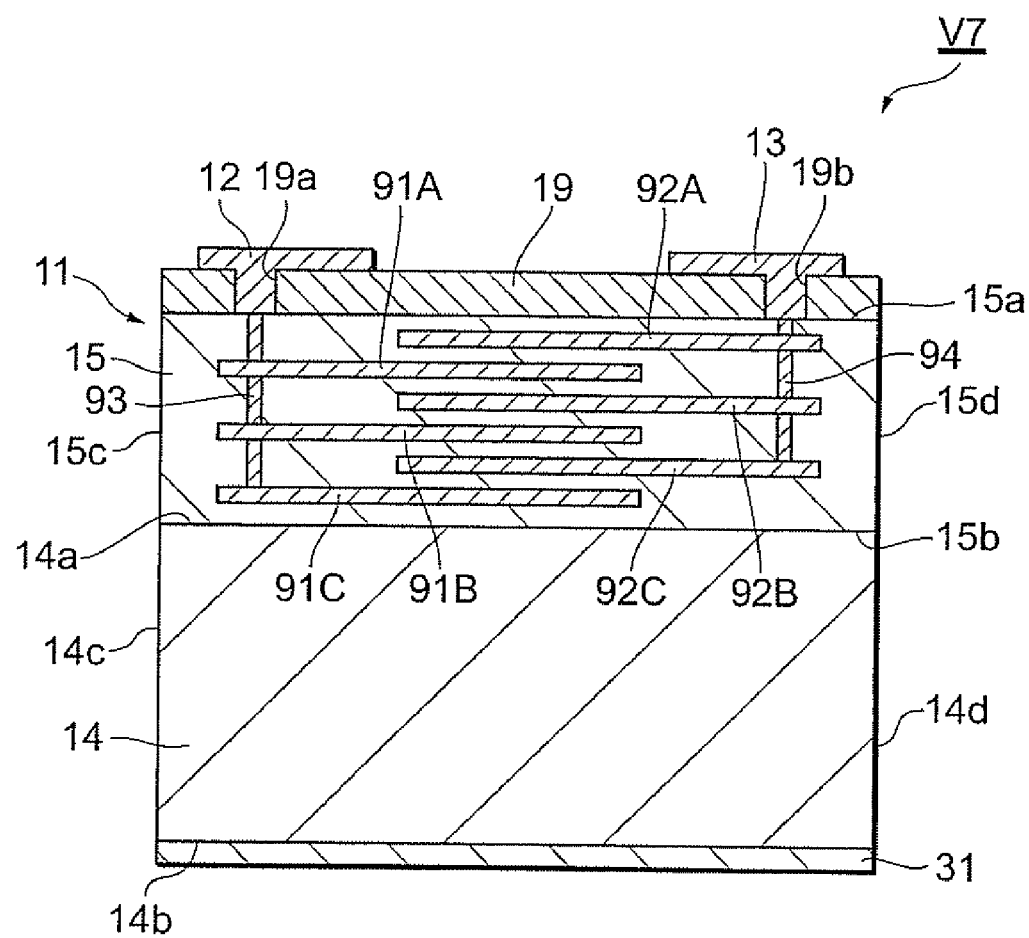
FIG. 9 is a schematic cross-sectional view illustrating a varistor in accordance with a seventh embodiment of the present invention.

A varistor in accordance with a seventh embodiment of the present invention, will be described. FIG. 9 is a schematic cross-sectional view illustrating the varistor in accordance with the seventh embodiment of the present invention. A varistor V7 illustrated in FIG. 9 differs from the varistor V2 in accordance with the second embodiment, in that a plurality of first internal electrides and a plurality of second internal electrodes are arranged, respectively.

In other words, similar to the varistor V2, the varistor V7 is not provided with a third internal electrode 18 (refer to FIG. 2), and instead, it includes a first internal electrode 91A and a second internal electrode 92A arranged inside a varistor element body 15 so that one-end sides thereof face each other. Moreover, in the varistor element body 15, first internal electrodes 91B and 91C and second internal electrodes 92B and 92C are arranged at the side of the heat radiating portion 14 than the first internal electrode 91A in the same positional relationship as that of the first internal electrode 91A and the second internal electrode 92A. In addition, the first internal electrodes 91A to 91C are connected to the external electrode 12 by a penetrating electrode 93 and the second internal electrode 92A to 92C are connected to the external electrode 13 by a penetrating electrode 94, respectively.

In the varistor V7, the varistor element body 15 contains ZnO as a main component, and the heat radiating portion 14 is formed with a composite material of metal Ag and metal oxides containing ZnO that is the main component of the varistor element body 15. Therefore, the bonding strength between the varistor portion 11 and the heat radiating portion 14 is sufficiently ensured, and heat conducted to the varistor portion 11 from an external element via the external electrodes 12 and 13, is radiated efficiently by conducting electrically conducted paths formed in the heat radiating portion 14 from the surface 14a to the surfaces 14b, 14c and 14d.

The present invention is not limited to the embodiments mentioned above. Although in each of the embodiments, ZnO is exemplified as semiconductor ceramics that is the main component of the varistor element body 15, $SrTiO_3$, $BaTiO_3$ SiC and the like in addition to the ZnO may be used as such semiconductor ceramics.

Moreover, the varistor portion 11 and the heat radiating portion 14 may be bonded by means of adhesion. As the varistors V1 to V7, a nitride-based semiconductor LED except for the GaN-based semiconductor LED, such as an InGaNAs-based semiconductor LED, may be connected, or a semiconductor LED or LD except for the nitride-based semiconductor LED or LD may be connected. Not limited to LED, various kinds of electronic elements such as an Field Effect Transistor (FET), a bipolar transistor or the like, which generate heat during operation, may be connected to them.

What is claimed is:

1. A varistor comprising:
a varistor portion including a varistor element body exhibiting voltage nonlinearity and internal electrodes arranged so that they sandwich the varistor element body and at least parts thereof face each other;
external electrodes connected to the internal electrodes for serving as connection ends of an external element; and
a heat radiating portion thermally connected to the varistor portion; wherein
the varistor element body contains semiconductor ceramics as a main component, and the heat radiating portion is composed of a composite material of a metal and metal oxides, and
the metal is electrically conducted in the heat radiating portion from a surface contacting with the varistor portion and a surface not contacting with the varistor portion.

2. A varistor comprising:
a varistor portion including a varistor element body exhibiting voltage nonlinearity, electrode portions arranged inside the varistor element body, and electrode portions which are arranged on a surface of the varistor element body and at least parts of which face the electrode portions arranged inside the varistor element body each other; and
a heat radiating portion thermally connected to the varistor portion; wherein
the varistor element body contains semiconductor ceramics as a main component, and the heat radiating portion is composed of a composite material of a metal and metal oxides, and
the metal is electrically conducted in the heat radiating portion from a surface contacting with the varistor portion and a surface not contacting with the varistor portion.

3. The varistor according to claim 1, wherein the metal oxides contain ZnO.

4. The varistor according to claim 2, wherein the metal oxides contain ZnO.

5. The varistor according to claim 1, wherein the metal oxides contain metal-coated $Al_2O_3$.

6. The varistor according to claim 2, wherein the metal oxides contain metal-coated $Al_2O_3$.

7. The varistor according to claim 1, wherein the metal contains Ag as a main component.

8. The varistor according to claim 2, wherein the metal contains Ag as a main component.

9. The varistor according to claim 3, wherein the metal contains Ag as a main component.

10. The varistor according to claim 4, wherein the metal contains Ag as a main component.

11. The varistor according to claim 1, wherein the varistor portion and the heat radiating portion are formed by firing simultaneously.

12. The varistor according to claim 2, wherein the varistor portion and the heat radiating portion are formed by firing simultaneously.

13. A light emitting device comprising a light emitting element and a varistor,
the varistor including:
a varistor portion including a varistor element body exhibiting voltage nonlinearity and internal electrodes arranged so that they sandwich the varistor element body and at least parts thereof face each other;
external electrodes connected to the internal electrodes for serving as connection ends of the light emitting element; and
a heat radiating portion arranged so as to be in contact with the varistor portion; wherein
the varistor element body contains ZnO as a main component, and the heat radiating portion is composed of a composite material of a metal and metal oxides, and
the metal is electrically conducted in the heat radiating portion from a surface contacting with the varistor portion and a surface not contacting with the varistor portion.

* * * * *